(12) United States Patent
DeBrosse

(10) Patent No.: US 6,191,988 B1
(45) Date of Patent: Feb. 20, 2001

(54) FLOATING BITLINE TIMER ALLOWING A SHARED EQUALIZER DRAM SENSE AMPLIFIER

(75) Inventor: John K. DeBrosse, Burlington, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/359,288

(22) Filed: Jul. 22, 1999

(51) Int. Cl.[7] ........................................ G11C 7/00
(52) U.S. Cl. ..................... 365/205; 365/233; 365/202; 365/196
(58) Field of Search ................... 365/233, 202, 365/196, 205

(56) References Cited

U.S. PATENT DOCUMENTS

| | | | |
|---|---|---|---|
| 4,941,128 | 7/1990 | Wada et al. | 365/203 |
| 5,444,662 | 8/1995 | Tanaka et al. | 365/203 |
| 5,521,869 | 5/1996 | Ishimura et al. | 365/189.01 |
| 5,684,736 | 11/1997 | Chan | 365/149 |
| 5,715,189 | 2/1998 | Asakura | 365/72 |
| 5,973,991 | * 10/1999 | Tsuchida et al. | 365/233 |

* cited by examiner

Primary Examiner—Amir Zarabian
Assistant Examiner—VanThu Nguyan
(74) Attorney, Agent, or Firm—McGinn & Gibb, PLLC; Daryl K. Neff, Esq.

(57) ABSTRACT

A method and structure for a dynamic random access memory chip includes memory element arrays having bitlines, a sense amplifier shared by the arrays. The sense amplifier includes multiplexors connected to the bitlines, an equalizer circuit connected to the multiplexors and a timer circuit connecting first bitlines to the sense amplifier a time period after second bitlines are sensed by the sense amplifier, wherein the time period is less than the active phase of the row cycle.

20 Claims, 3 Drawing Sheets

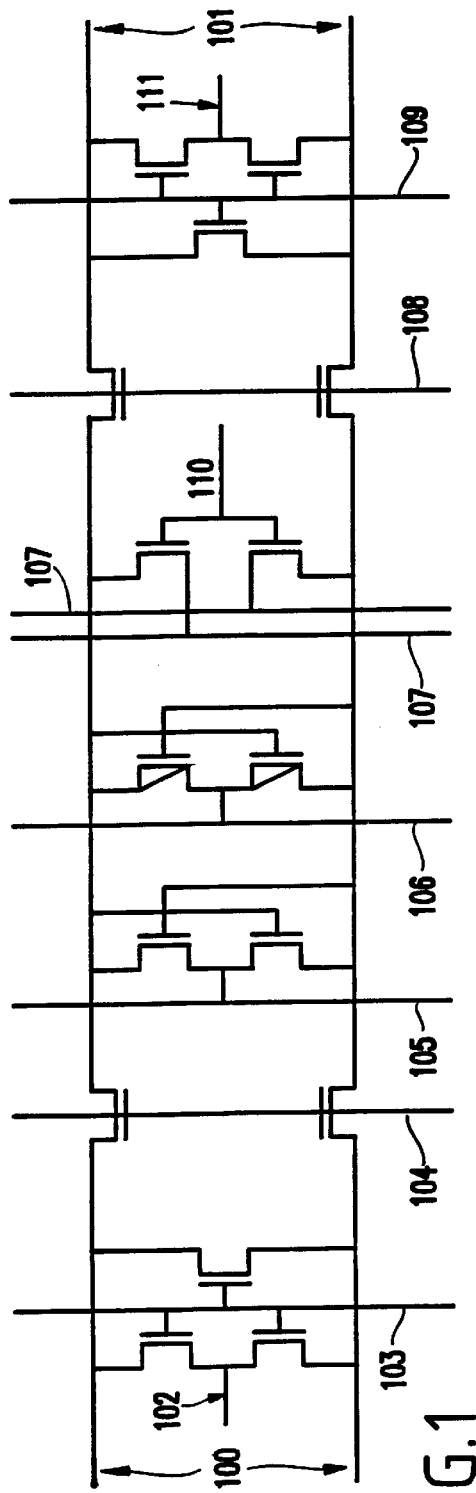
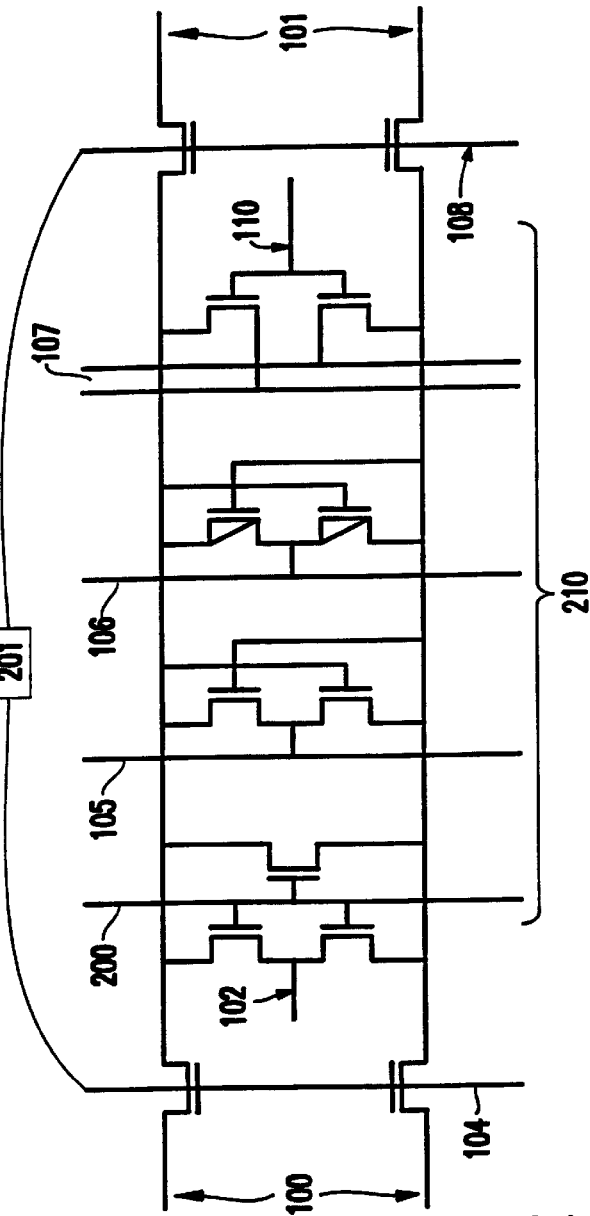
FIG.1 PRIOR ART
FIG.2

FLOATING BITLINE TIMER ALLOWING A SHARED EQUALIZER DRAM SENSE AMPLIFIER

BACKGROUND OF THE INVENTION

1. Field of the Invention

The present invention relates to sense amplifiers and more particularly to a new sense amplifier having a shared equalizer circuit and a timer circuit to prevent the inactive bitlines from floating for long time periods.

2. Description of the Related Art

Integrated circuit memory devices are commonly divided into arrays of memory cells. Usually only one of the arrays is activated during a given access cycle to reduce power consumption and increase the efficiency of the integrated circuit. Because of this operation, a sense amplifier or an array of sense amplifiers are positioned between the memory cell arrays. This allows the sense amplifier to be shared by adjacent arrays, thereby decreasing chip area consumed by the memory device, decrease the production costs and increasing processing speed.

A conventional shared dynamic random access memory (DRAM) sense amplifier (SA) is shown in FIG. 1. The sense amplifier includes equalizer circuits 103, 109 which are supplied with bitline equalization voltages 102, 111. The equalizer circuits 103, 109 are outside the multiplexors 104, 108. Additionally data lines 107 are selected by a column select signal 110. A cross-coupled pair of NFETs 105 and a cross-coupled pair of PFETs 106 are also part of the same sense amplifier and perform the signal sensing and data latching functions of the sense amplifier. The bitlines 100, 101 which are connected to the adjacent arrays are also illustrated. Having two multiplexor (MUX) devices 104, 108 allows the sense amplifier to service two arrays, thus increasing layout efficiency.

During a precharging operation, the sets of bitlines 100, 101 are adjusted to an equalizing potential which is generally midway between the active bitline high potential and the active bitline low potential. During the active phase of the row cycle, one each pair of active bitlines is raised to the active bitline high level and the other is lowered to the active bitline low level. During the precharge phase of the row cycle, these bitlines are connected together and equalized to a voltage midway between the active bitline high and low levels.

SUMMARY OF THE INVENTION

It is, therefore, an object of the present invention to provide a structure and method for a dynamic random access memory chip including memory element arrays having bitlines, a sense amplifier shared by the arrays (the sense amplifier includes multiplexors connected to the bitlines and an equalizer circuit) and a timer circuit connecting first bitlines to the sense amplifier a time period after second bitlines are sensed by the sense amplifier, wherein the time period is less than the active phase of the row cycle.

The second bitlines are connected to active arrays. The time period is approximately 1 μs. The timer circuit can include a plurality of timer circuits, where one of the timer circuits is connected to each of the arrays, is connected to each bank of the arrays, or is connected to each of the sense amplifiers. The sense amplifier includes only one equalizer circuit which equalizes both the first bitlines and the second bitlines.

The invention also comprises a method of equalizing bitlines in memory element arrays having a sense amplifier shared by the arrays. The sense amplifier includes multiplexors connected to the bitlines, and an equalizer circuit connected to the multiplexors. The method includes beginning a sensing of first bitlines, allowing a time period to elapse and connecting second bitlines to the sense amplifier. The time period is less than the active phase of the row cycle. The first bitlines are connected to an active array. The time period is approximately 1 μs. The sense amplifier includes only one equalizer circuit. The timer circuit allows the elapsing of the time period.

The invention allows the use of a sense amplifier serving multiple arrays that can properly operate with a single equalizer circuit without causing an excessive current demand on the bitline equalization voltage source. Thus, the invention reduces the cost, complexity and the space required for a sense amplifier.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a conventional sense amplifier;

FIG. 2 is a schematic diagram of a sense amplifier according to the invention;

DETAILED DESCRIPTION OF PREFERRED EMBODIMENTS OF THE INVENTION

Figure 3:
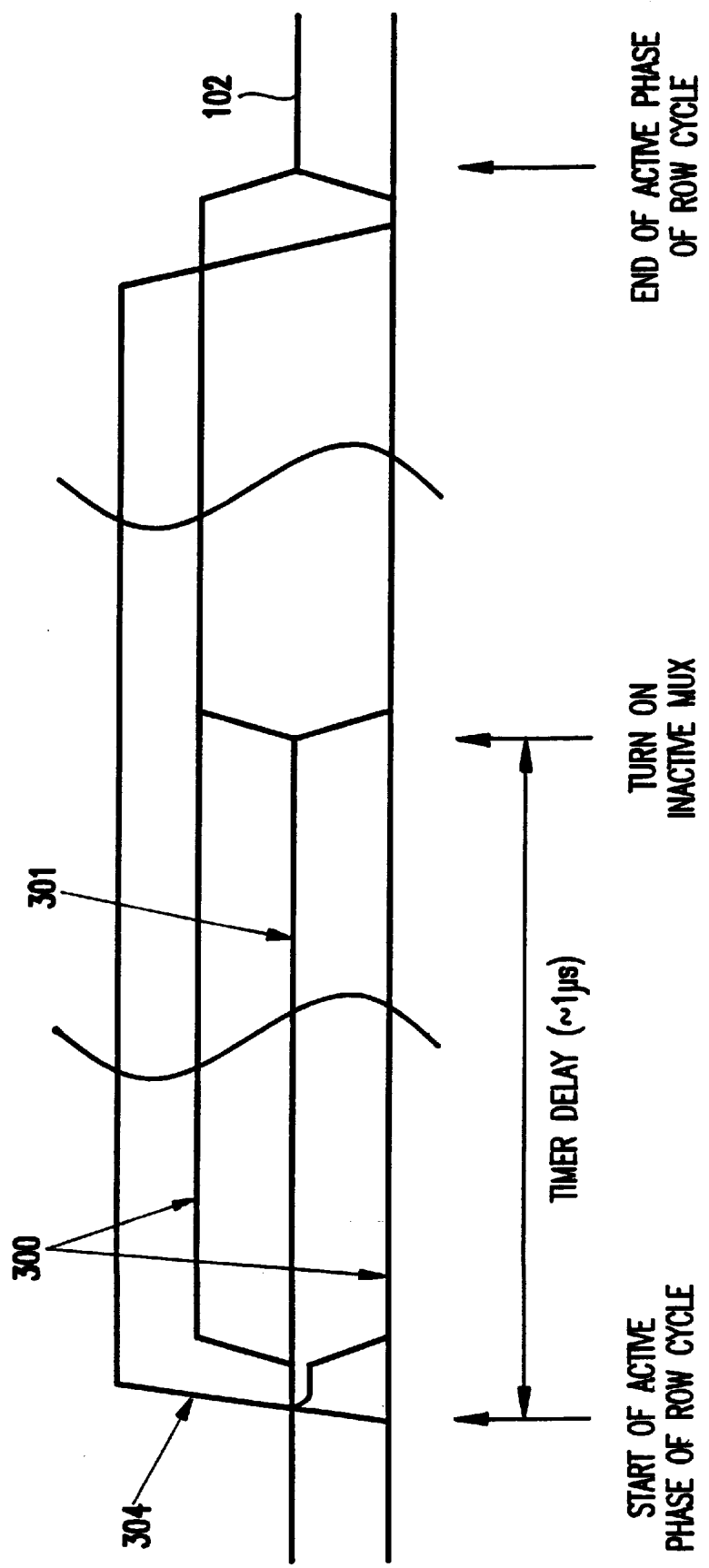
FIG. 3 is a timing diagram illustrating the operation of the inventive sense amplifier shown in FIG. 2.

As mentioned above, having two multiplexor (MUX) devices 104, 108 allows the sense amplifier to service two arrays, thus increasing layout efficiency. However, in the structure shown in FIG. 1, the equalizer circuits 103,109 are outside of each multiplexor 104,108 and are therefore not shared. It is more efficient to share the equalizer circuit 200 by placing it inside the multiplexor devices 104,108 as shown in FIG. 2, eliminating the need for one of the two equalizer circuits 103,109, thus further increasing the layout efficiency.

Utilizing a single equalizer circuit is currently not very popular because when one of the two arrays is active, the bitlines of the inactive array are left floating. Thus, when an equalizer circuit is shared, one of the pairs of bitlines is equalized first, using a row address strobe (RAS), as described in the Background section. The other pair of bitlines is left floating until the end of the active phase of the row cycle. This causes the floating bitlines to drift or float from the equalized voltage because of parasitic leakage.

Since the active array may remain active for up to the maximum row address strobe, which is typically as long as 100us, the floating bitlines of the inactive array may leak voltage and be far from the desired bitline equalization voltage (vbleq) to which they had been previously set.

When the active array is eventually precharged, the sense amplifier will attempt to equalize the bitlines 100,101 of both arrays to the desired bitline equalization voltage. However, since the inactive array bitlines may have leaked voltage, the generator for the bitline equalization voltage 102 or 110 will see a demand which may (and often does) exceed its capacity. In turn, this will cause a disturbance of the bitline equalization voltage, creating the possibility of a failure in a subsequent sensing operation.

This floating bitline problem is avoided with the invention. More specifically, as shown in FIG. 2, the invention includes a timer circuit 201 which causes the multiplexor devices on the inactive side of the shared equalizer circuit 200 to be turned on after the active bitlines have been sensed. As would be known by one ordinarily skilled in the art, the timer circuit 201 could have any conventional structure, so long as the structure has the ability to output a signal or voltage a given time period after another signal is received by the timer circuit.

FIG. 3 is a timing diagram illustrating the voltage levels of the various signals in the sense amplifier 210 and the operation of the timer circuit 201. At the start of the active phase of the row cycle the equalizer circuit turns off, the inactive multiplexor turns off and the wordline 304 changes from a low signal to a high signal. Shortly thereafter, the active bitlines 300 are sensed by the sense amplifier and forced to bitline high and bitline low signal levels (vblh 302, vbll 303). The inactive bitlines 301, which were previously floating, are connected to the sense amplifier (by turning on the inactive multiplexor) which forces the inactive bitlines 301 to the bitline high vblh 302 and low levels vbll 303, after the delay period imposed by the timer circuit 201. All bitlines remain at the high and low levels until the bitlines are precharged (e.g., at the end of the active phase of the row cycle), at which time the bitlines of both arrays will equalize to the desired bitline equalization voltage, which is the midpoint between vblh 302 and vbll 303.

The timer 201 delay is chosen to be sufficiently short so that the inactive bitlines do not float too long (so as to prevent the bitline equalization voltage disturbance discussed above), yet sufficiently long so that the bitline equalization current used to charge the inactive bitlines does not add significantly to the chip power consumption. Therefore, the connection of the inactive bitlines to the sense amplifier is preferably started at some point during the active phase of the row cycle. For example, in most situations a delay between 100 ns and 100 $\mu$s, and preferably 1 $\mu$s, would likely meet both of these criteria In other words, the shared equalizer circuit 200 of the sense amplifier 210 is operated to precharge the active bitlines and a timer is started at the start of the active phase of the row cycle. The inactive multiplexor devices 104 or 108, which are turned off at the start of the active phase of the row cycle, are turned on to precharge the inactive bitlines at the end of the timer delay or at the end of the active phase of the row cycle, (whichever occurs first). The shared equalizer circuit 200 is turned off at the start of the active phase of the row cycle and turned on again at the end of the active phase of the row cycle.

Figure 4:
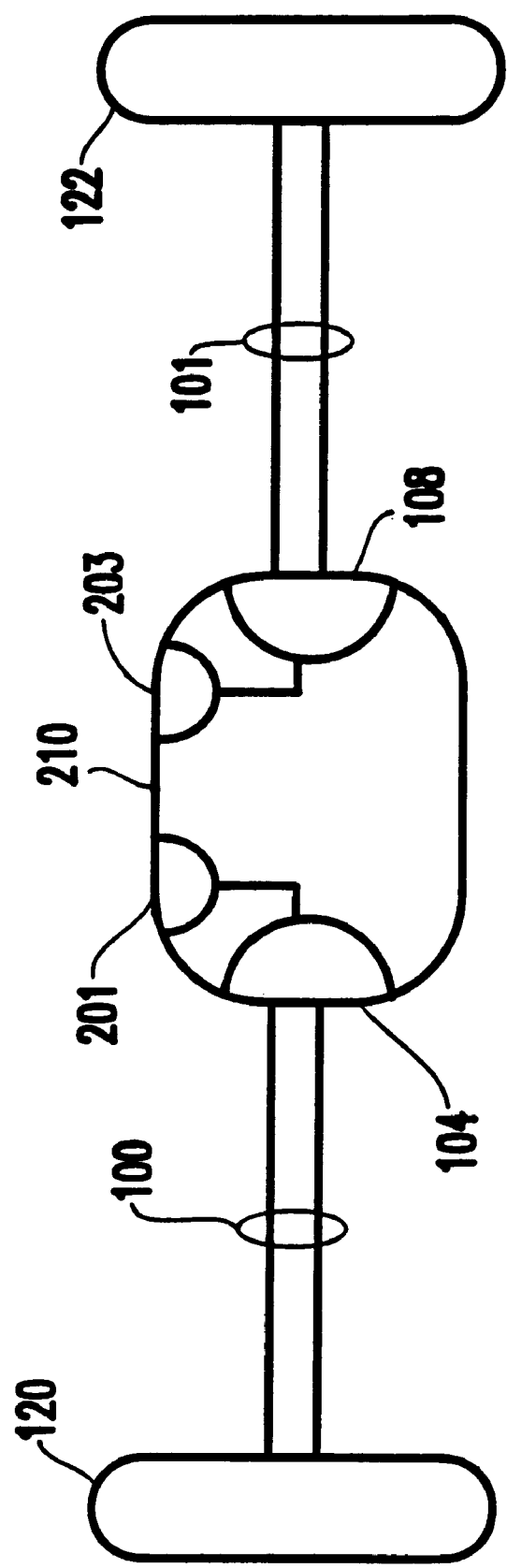
FIG. 4 is a schematic diagram illustrating the sense amplifier shown in FIG. 2 as it is positioned between arrays of memory cells.

While one timer circuit 201 which individually controls each multiplexor 104, 108 in the sense amplifier is shown in FIG. 2, as would be known by one ordinarily skilled in the art given this disclosure, the invention may be implemented in many possible embodiments. For example, the invention may include one timer circuit per array block, one timer circuit per sense amplifier 210 (as shown in FIG. 2), one timer circuit 201, 203 per bank 120, 122 (as shown in FIG. 4), one timer circuit per chip, etc. The best combination regarding the number and connection of timing circuits can be implemented by the designer after evaluating the tradeoffs between power consumption, circuit complexity, layout considerations, etc. to determine the best choice for a particular application.

Furthermore, the invention may be implemented so as to limit the number of sense amplifiers 210 which may have their inactive multiplexor devices 104 or 108 turned on simultaneously. This would reduce the impact on the bitline high voltage generator and the bitline low voltage generator and would reduce the magnitude of the bitline equalization voltage disturbance which may occur in the event that a precharge command is received while the inactive bitlines 301 are being asymmetrically charged to vblh 302 and vbll 303.

Therefore, with the invention, a sense amplifier serving multiple arrays can properly operate with a single equalizer circuit without causing an excessive current demand on the bitline equalization voltage source. Thus, the invention reduces the cost, complexity and the space required for a sense amplifier.

While the invention has been described in terms of preferred embodiments, those skilled in the art will recognize that the invention can be practiced with modification within the spirit and scope of the appended claims.

What is claimed is:

1. A dynamic random access memory chip comprising:
   memory element arrays having bitlines;
   a sense amplifier shared by said arrays, said sense amplifier including multiplexors connected to said bitlines, and an equalizer circuit connected to said multiplexors; and
   a timer circuit connecting first bitlines of said bitlines to said sense amplifier a time period after second bitlines of said bitlines are sensed by said amplifier, wherein said time period is less than an active phase of a row cycle of said bitlines.

2. The dynamic random access memory chip as in claim 1, wherein said second bitlines are connected to an active array of said arrays.

3. The dynamic random access memory chip as in claim 1, wherein said time period is approximately 1 $\mu$s.

4. The dynamic random access memory chip as in claim 1, wherein said timer circuit comprises a plurality of timer circuits, and one of said timer circuits is connected to each of said arrays.

5. The dynamic random access memory chip as in claim 1, wherein said timer circuit comprises a plurality of timer circuits, and one of said timer circuits is connected to each of said arrays.

6. The dynamic random access memory chip as in claim 1, wherein said timer circuit comprises a plurality of timer circuits and said sense amplifier comprises a plurality of sense amplifiers, wherein one of said timer circuits is connected to each of said sense amplifiers.

7. The dynamic random access memory chip as in claim 1, wherein said sense amplifier includes only one equalizer circuit which equalizes voltages on both said first bitlines and said second bitlines.

8. A timer circuit for use in memory element arrays having bitlines, at least one sense amplifier being shared by said arrays, said sense amplifier including multiplexors connected to said bitlines, and an equalizer circuit connected to said multiplexors,
   said timer circuit connecting first bitlines of said bitlines to said sense amplifier a time period after second bitlines of said bitlines are sensed by said sense amplifier, wherein said time period is less than an active phase of a row cycle of said bitlines.

9. The timer circuit in claim 8, wherein said second bitlines are connected to an active array of said arrays.

10. The timer circuit in claim 8, wherein said time period is approximately 1 µs.

11. The timer circuit in claim 8, wherein said timer circuit comprises a plurality of timer circuits, and one of said timer circuits is connected to each of said arrays.

12. The timer circuit in claim 8, wherein said timer circuit comprises a plurality of timer circuits, and one of said timer circuits is connected to each bank of said arrays.

13. The timer circuit in claim 8, wherein said timer circuit comprises a plurality of timer circuits and said sense amplifier comprises a plurality of sense amplifiers, wherein one of said timer circuits is connected to each of said sense amplifiers.

14. The timer circuit in claim 8, wherein said sense amplifier includes only one equalizer circuit which equalizes voltages on both said first bitlines and said second bitlines.

15. A method of equalizing bitlines in memory element arrays having a sense amplifier shared by said arrays, said sense amplifier including multiplexors connected to said bitlines, and an equalizer circuit connected to said multiplexors, said method comprising:

beginning a sensing of first bitlines of said bitlines;

allowing a time period to elapse; and connecting second bitlines of said bitlines to said sense amplifier, said time period being less than an active phase of a row cycle of said bitlines.

16. The method in claim 15, wherein said first bitlines are connected to an active array of said arrays.

17. The method in claim 15, wherein said time period is approximately 1 µs.

18. The method in claim 15, wherein said sense amplifier includes only one equalizer circuit.

19. The method in claim 18, further comprising equalizing said first bitlines using said one equalizer circuit and subsequently equalizing said second bitlines using said one equalizer circuit.

20. The method in claim 15, wherein said allowing said elapsing of said time period is performed using a timer circuit.

\* \* \* \* \*

UNITED STATES PATENT AND TRADEMARK OFFICE
CERTIFICATE OF CORRECTION

PATENT NO. : 6,191,988
DATED : February 20, 2001
INVENTOR(S) : John K. DeBrosse

Page 1 of 1

It is certified that error appears in the above-identified patent and that said Letters Patent is hereby corrected as shown below:

On the Title Page, ITEM 75, should read:
Inventor: John K. DeBrosse, Colchester, VT (US)

Signed and Sealed this

Fifth Day of June, 2001

Attest:

Attesting Officer

NICHOLAS P. GODICI
*Acting Director of the United States Patent and Trademark Office*